United States Patent
Ok et al.

(10) Patent No.: US 11,264,569 B2
(45) Date of Patent: Mar. 1, 2022

(54) PHASE CHANGE MEMORY DEVICE

(71) Applicant: INTERNATIONAL BUSINESS MACHINES CORPORATION, Armonk, NY (US)

(72) Inventors: Injo Ok, Loudonville, NY (US); Kevin W. Brew, Albany, NY (US); Timothy M. Philip, Albany, NY (US); Muthumanickam Sankarapandian, Niskayuna, NY (US); Sanjay C. Mehta, Niskayuna, NY (US); Nicole Saulnier, Slingerlands, NY (US); Steven M. Mcdermott, Wynantskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 53 days.

(21) Appl. No.: 16/671,748

(22) Filed: Nov. 1, 2019

(65) Prior Publication Data
US 2021/0135104 A1 May 6, 2021

(51) Int. Cl.
*H01L 45/00* (2006.01)
*G11C 13/00* (2006.01)

(52) U.S. Cl.
CPC ........ *H01L 45/144* (2013.01); *G11C 13/0004* (2013.01); *H01L 45/12* (2013.01); *H01L 45/124* (2013.01); *H01L 45/1233* (2013.01); *H01L 45/1608* (2013.01)

(58) Field of Classification Search
CPC .................................................... H01L 45/124
See application file for complete search history.

(56) References Cited

U.S. PATENT DOCUMENTS

| 7,671,360 B2 | 3/2010 | Sato et al. |
| 7,923,712 B2 | 4/2011 | Arnold et al. |
| 8,138,028 B2 | 3/2012 | Lung et al. |

(Continued)

FOREIGN PATENT DOCUMENTS

KR  10-2006-0122266  11/2006

OTHER PUBLICATIONS

Lee, J. I. "Highly scalable phase change memory with CVD GeSbTe for sub 50 nm generation" Proc. Symp. Very Large Scale Integr. (VLSI) Technol., Aug. 10, 2007, pp. 102-103 (Year: 2007).*

(Continued)

*Primary Examiner* — Grant S Withers
(74) *Attorney, Agent, or Firm* — Tutunjian & Bitetto, P.C.; L. Jeffrey Kelly

(57) ABSTRACT

A phase change material memory device is provided. The phase change material memory device includes one or more electrical contacts in a substrate, and a dielectric cover layer on the electrical contacts and substrate. The phase change material memory device further includes a lower conductive shell in a trench above one of the one or more electrical contacts, and an upper conductive shell on the lower conductive shell in the trench. The phase change material memory device further includes a conductive plug filling the upper conductive shell. The phase change material memory device further includes a liner layer on the dielectric cover layer and conductive plug, and a phase change material block on the liner layer on the dielectric cover layer and in the trench.

7 Claims, 10 Drawing Sheets

(56) References Cited

U.S. PATENT DOCUMENTS

| | | |
|---|---|---|
| 8,426,967 B2 | 4/2013 | Joseph et al. |
| 8,471,236 B2 | 6/2013 | Breitwisch et al. |
| 8,633,464 B2 | 1/2014 | Breitwisch et al. |
| 9,293,199 B2 | 3/2016 | Krebs et al. |
| 9,508,927 B1 | 11/2016 | Tao et al. |
| 2003/0116794 A1* | 6/2003 | Lowrey ................. H01L 45/16 257/296 |
| 2008/0316793 A1 | 12/2008 | Philipp et al. |

OTHER PUBLICATIONS

Ding et al., "Phase-Change Heterostructure Enables Ultralow Noise and Drift for Memory Operation", Science, Aug. 2019, pp. 1-12.
Koelmans et al., "Projected phase-change memory devices", Nature Communications, Sep. 2015, pp. 1-7.

* cited by examiner

PHASE CHANGE MEMORY DEVICE

BACKGROUND

The present invention generally relates to phase change memory devices, and more particularly to phase change memory devices having a phase change region with a mushroom shape.

Phase change material can be used as a type of non-volatile memory to store data. Each memory cell of a phase-change random access memory can include phase change material that can be addressed. The information can be stored in the phase change material by changing the electrical resistance of the phase change material.

SUMMARY

In accordance with an embodiment of the present invention, a phase change material memory device is provided. The phase change material memory device includes one or more electrical contacts in a substrate, and a dielectric cover layer on the electrical contacts and substrate. The phase change material memory device further includes a lower conductive shell in a trench above one of the one or more electrical contacts, and an upper conductive shell on the lower conductive shell in the trench. The phase change material memory device further includes a conductive plug filling the upper conductive shell. The phase change material memory device further includes a liner layer on the dielectric cover layer and conductive plug, and a phase change material block on the liner layer on the dielectric cover layer and in the trench.

In accordance with another embodiment of the present invention, a phase change material memory device is provided. The phase change material memory device includes one or more electrical contacts in a substrate, and a dielectric cover layer on the electrical contacts and substrate. The phase change material memory device further includes a trench in the dielectric cover layer above one of the one or more electrical contacts, and a lower conductive layer on the dielectric cover layer and in the trench. The phase change material memory device further includes an upper conductive shell in the trench on the lower conductive layer, and an insulating plug filling the upper conductive shell. The phase change material memory device further includes a liner layer on the dielectric cover layer and conductive plug, and a phase change material block on the liner layer on the dielectric cover layer and in the trench.

In accordance with yet another embodiment of the present invention, a method of forming a phase change material memory device is provided. The method includes forming a dielectric cover layer on a substrate and one or more electrical contacts in the substrate. The method further includes forming a trench in the dielectric cover layer over one of the one or more electrical contacts. The method further includes forming a lower conductive layer in the trench, and forming an upper conductive layer on the lower conductive layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a phase change memory device having a mushroom shaped phase change material (PCM) region formed from the germanium-antimony-tellurium (GeSbTe or GST) group of chalcogenide glasses. The mushroom shaped PCM region can be confined in a trench to concentrates electrical current and heat within the phase-change material. The concentration of electrical current and heat within the phase-change material can reduce the amount of current utilized to reset the phase change material. The phase-change memory devices can exhibit remarkably low drift and excellent noise performance.

Embodiments of the present invention provide a method of fabricating a phase change memory device having a mushroom shaped PCM region by forming trenches in a cover layer and forming resistive liners, heaters, and the phase change material in the trenches. The recessed heater design can provide improved linearity and reduced reset current requirements without forming a full confined cell type phase change memory device.

Embodiments of the present invention provide a phase change memory device having a mushroom shaped cell structure, a bottom heater that concentrates current into the phase change material, and a liner layer that reduces resistance drift. The PCM device can be designed in such a way that the physical mechanism of information storage is decoupled from the information-retrieval process.

Exemplary applications/uses to which the present invention can be applied include, but are not limited to: memory devices, including NAND or NOR flash memory devices.

It is to be understood that aspects of the present invention will be described in terms of a given illustrative architecture; however, other architectures, structures, substrate materials and process features and steps can be varied within the scope of aspects of the present invention.

Figure 1:
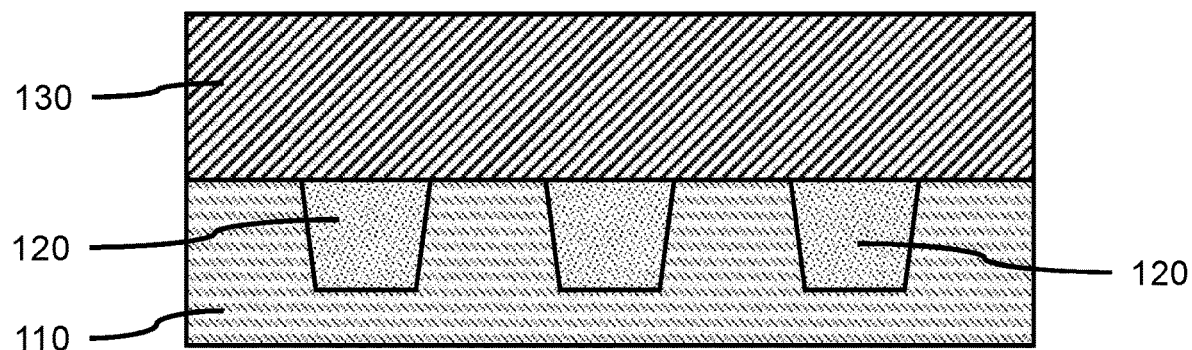
FIG. 1 is a cross-sectional side view showing electrical contacts in a substrate with a dielectric cover layer on the electrical contacts and substrate surface, in accordance with an embodiment of the present invention.

Referring now to the drawings in which like numerals represent the same or similar elements and initially to FIG. 1, a cross-sectional side view of electrical contacts in a substrate with a dielectric cover layer on the electrical contacts and substrate surface is shown, in accordance with an embodiment of the present invention.

In one or more embodiments, one or more electrical contacts 120 can be formed in a substrate 110, where the electrical contacts 120 can be formed by lithographic processes and etching to form a groove in a substrate 110, and filling the groove with a conductive material.

In various embodiments, the electrical contacts 120 can be made of a conductive material, including, but not limited to, a metal, for example, copper (Cu), nickel (Ni), cobalt (Co), molybdenum (Mo), tungsten (W), aluminum (Al), silver (Ag), gold (Au), platinum (Pt); a conductive carbon, for example, graphene, carbon nanotubes, carbon fibers; a metal compound, for example, titanium nitride (TiN) and tantalum nitride (TaN); and combinations thereof.

In one or more embodiments, a dielectric cover layer 130 can be formed on the electrical contacts and substrate surface, where the dielectric cover layer 130 can be formed by a deposition process, including, but not limited to, chemical vapor deposition (CVD), atomic layer deposition (ALD), physical vapor deposition (PVD), plasma enhanced versions thereof, a spin-on method, and combinations thereof.

In various embodiments, the dielectric cover layer 130 can be an electrically insulating dielectric material, including, but not limited to, silicon oxide (SiO), silicon nitride (SiN), silicon oxynitride (SiON), silicon oxy carbide (SiOC), silicon carbonitride (SiCN), silicon boro carbonitride (SiBCN), low-k dielectrics, and combinations thereof. Low-k dielectric can include, but not be limited to, carbon doped silicon oxide or organosilicate glasses (SiO:C), fluorine doped silicon oxide (SiO:F), silicon based polymeric dielectric materials, for example, hydrogen silsesquioxane (HSQ) and methylsilsesquioxane (MSQ), tetraethyl orthosilicate (TEOS), and combinations thereof.

In various embodiments, the dielectric cover layer 130 can have a thickness in a range of about 20 nm to about 150 nm, or about 35 nm to about 100 nm, or about 45 nm to about 75 nm, although other depths are also contemplated.

Figure 2:
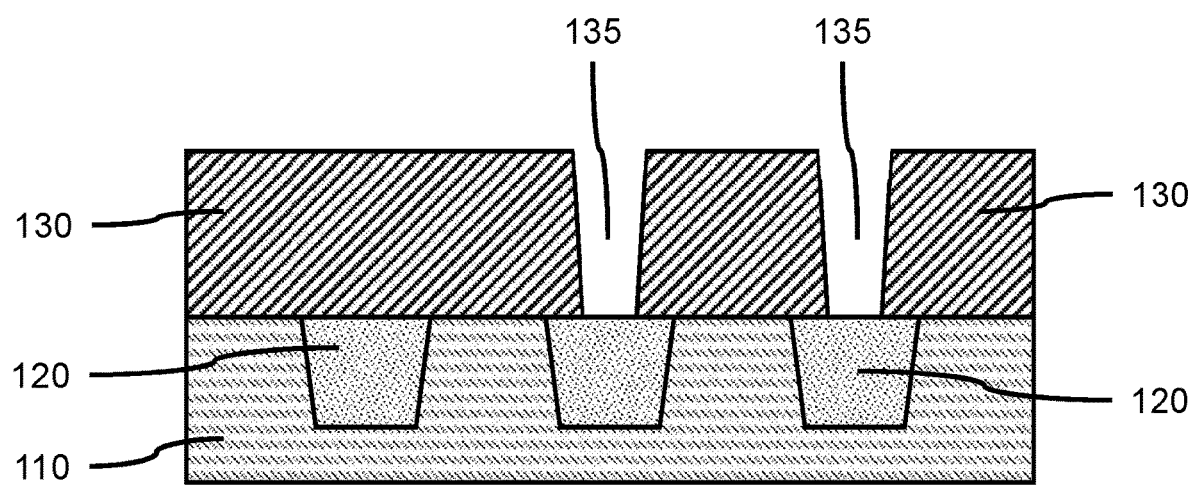
FIG. 2 is a cross-sectional side view showing trenches formed in the dielectric cover layer above the electrical contacts, in accordance with an embodiment of the present invention.

FIG. 2 is a cross-sectional side view showing trenches formed in the dielectric cover layer above the electrical contacts, in accordance with an embodiment of the present invention.

In one or more embodiments, a trench 135 can be formed in the dielectric cover layer 130 over an electrical contact 120, where the trench 135 can be formed by masking the dielectric cover layer 130 with a resist, patterning the resist and removing exposed portions of the dielectric cover layer 130 by etching, for example, with a selective, directional etch (e.g., reactive ion etching (RIE)). A portion of the dielectric cover layer 130 can be removed to expose the surface of an electrical contact 120 at the bottom of the trench 135. In various embodiments, a trench 135 can be formed over each of the one or more electrical contacts 120. The width of the trench 135 can be less than the width of the electrical contact 120.

In various embodiments, the trench 135 can be round or square and have a width or diameter in a range of about 25 nanometers (nm) to about 40 nm, or about 25 nm to about 35 nm, or about 28 nm, although other widths/diameters are also contemplated. Other shapes of the trench 135 are also contemplated, including, but not limited to, rectangular with the same range of widths, oval, elliptical, and polygonal.

In various embodiments, the trench 135 can have a depth in a range of about 20 nm to about 150 nm, or about 35 nm to about 100 nm, or about 45 nm to about 75 nm, although other depths are also contemplated. The depth of the can be the same as the thickness of the dielectric cover layer 130 between the top surface of an electrical contact 120 and the top surface of the dielectric cover layer 130, where the trench 135 exposes the surface of an electrical contact 120.

Figure 3:
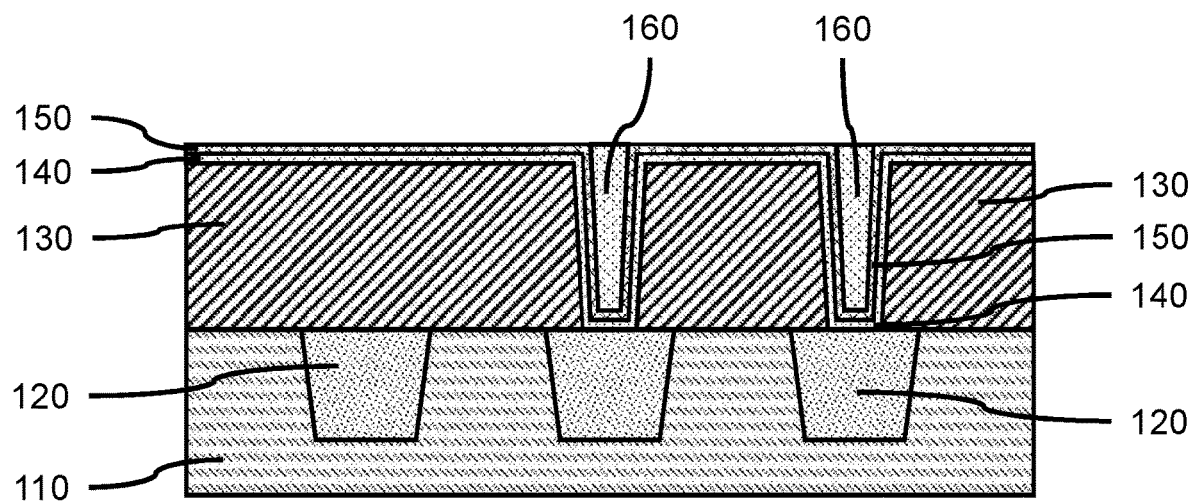
FIG. 3 is a cross-sectional side view showing conductive layers of bottom heaters formed in the trenches on the electrical contacts, in accordance with an embodiment of the present invention.

FIG. 3 is a cross-sectional side view showing conductive layers of bottom heaters formed in the trenches on the electrical contacts, in accordance with an embodiment of the present invention.

In one or more embodiments, a plurality of conductive layers can be formed in the trenches 135 to form a bottom heater. In various embodiments, a lower conductive layer 140 can be formed on the exposed surfaces of the dielectric cover layer 130 and the trench(es) 135, where the lower conductive layer 140 can be formed by a conformal deposition, for example, atomic layer deposition (ALD), plasma enhanced atomic layer deposition (PEALD), and combinations thereof. In various embodiments, the lower conductive layer 140 can be omitted.

In various embodiments, the lower conductive layer 140 can be a metal compound including, but not limited to, tantalum nitride (TaN), tantalum carbide (TaC), hafnium nitride (HfN), hafnium carbibe (HfC), and combinations thereof. In various embodiments, the lower conductive layer 140 can be a metal compound having a resistivity of about 45 kOhm/sq at 5 nm thickness.

In various embodiments, the lower conductive layer 140 can have a thickness in a range of about 4 nanometers (nm) to about 10 nm, or about 5 nm to about 6 nm, although other thicknesses are also contemplated.

In one or more embodiments, an upper conductive layer 150 can be formed on the lower conductive layer 140, where the upper conductive layer 150 can be formed by a conformal deposition (e.g., ALD, PEALD). The upper conductive layer 150 can be formed on the lower conductive layer 140 on the sidewalls and bottom of the trench 135.

In various embodiments, the upper conductive layer 150 can be a metal or metal compound, including, but not limited to, titanium nitride (TiN), tungsten (W), tantalum nitride (TaN), platinum (Pt), and combinations thereof. The upper conductive layer 150 can have a resistivity and/or resistance lower than the resistivity of the lower conductive layer 140 to allow larger current flow than that through lower conductive layer 140.

In various embodiments, the upper conductive layer 150 can have a thickness in a range of about 4 nanometers (nm) to about 10 nm, or about 5 nm to about 6 nm, although other thicknesses are also contemplated.

In one or more embodiments, a conductive plug layer 160 can be formed on the upper conductive layer 150, where the conductive plug layer 160 can be formed by a conformal deposition (e.g., ALD, PEALD). The conductive plug layer 160 can fill in the remaining volume of the trench(es) 135, where the conductive plug layer 160 may not form a void space in the trench(es) 135. A chemical-mechanical polishing and/or selective isotropic etch can be used to remove portions of the conductive plug layer 160 from the surface of the upper conductive layer 150, while portions of the conductive plug layer 160 remain in the trench(es) 135.

In various embodiments, the conductive plug layer 160 can be a metal compound including, but not limited to, tantalum nitride (TaN), tantalum carbide (TaC), hafnium nitride (HfN), hafnium carbibe (HfC), and combinations thereof. In various embodiments, the conductive plug layer 160 can be a metal compound having a resistivity of about 45 kOhm/sq at 5 nm thickness.

In one or more embodiments, the portions of the conductive plug layer 160, upper conductive layer 150, and lower conductive layer 140 on the top surface of the dielectric cover layer 130 can be removed to leave portions of the conductive plug layer 160, upper conductive layer 150, and lower conductive layer 140 in the trench 135. In various embodiments, a chemical-mechanical polishing can be removed to provide a flat coplanar surface of the conductive plug layer 160, upper conductive layer 150, and lower conductive layer 140 in the trench 135.

Figure 4:
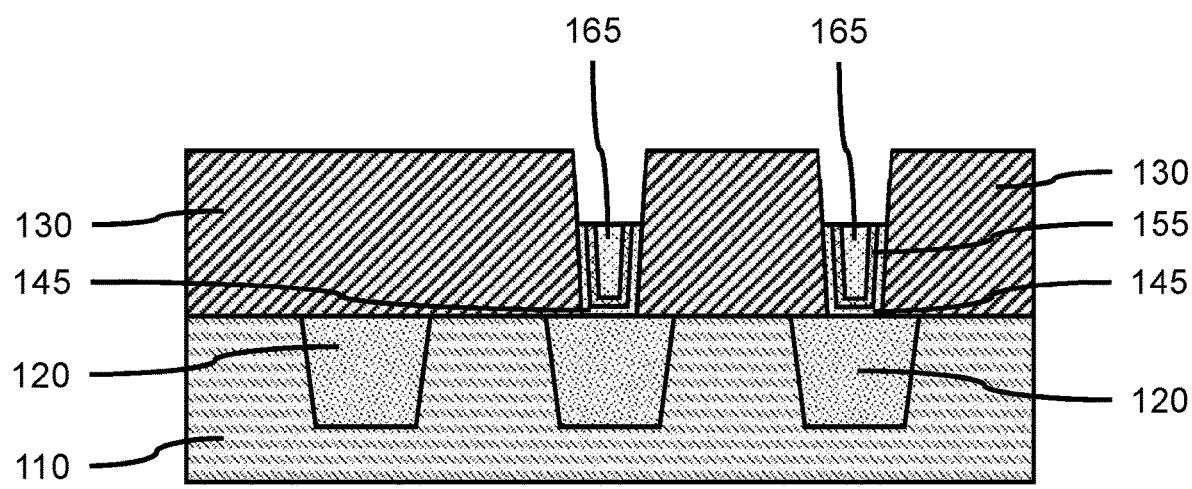
FIG. 4 is a cross-sectional side view showing the conductive layers of the bottom heaters recessed in the trenches, in accordance with an embodiment of the present invention.

FIG. 4 is a cross-sectional side view showing the conductive layers of the bottom heaters recessed in the trenches, in accordance with an embodiment of the present invention.

In one or more embodiments, portions of the conductive plug layer 160, upper conductive layer 150, and lower conductive layer 140 can be removed using a series of selective reactive ion etchings, wet chemical etchings, and/or dry plasma etchings to recess the conductive plug layer 160, upper conductive layer 150, and lower conductive layer 140 in the trench(es) 135 to form a lower conductive shell 145, an upper conductive shell 155, and a conductive plug 165 in the lower regions of the trench(es) 135. The conductive plug layer 160, upper conductive layer 150, and lower conductive layer 140 can be recessed by partially recessing the dielectric cover layer 130, forming a hardmask layer on the dielectric cover layer 130 for protection before etching, and removing the hardmask layer after etching. The lower conductive shell 145, upper conductive shell 155, and conductive plug 165 can form a bottom heater in each of the trenches 135, where the bottom heaters are in electrical contact with the electrical contacts 120. The lower conductive shell 145 and upper conductive shell 155 can each have a nesting cup shape, where the lower conductive shell 145 conforms to the contours of the trench 135, the upper conductive shell 155 conforms to the contours of the lower conductive shell 145, and the conductive plug 165 conforms to the contours of the upper conductive shell 155, and can fill the upper conductive shell. The bottom heaters can provide a current path for generating changes in temperature electrically that can change the crystal/amorphized phase of the phase-change material (e.g., GST).

Figure 5:
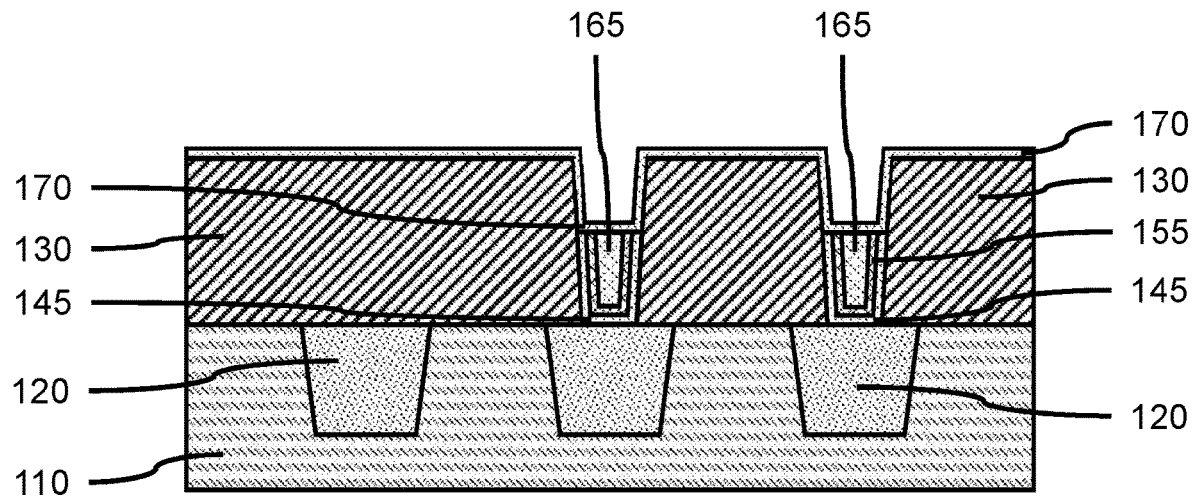
FIG. 5 is a cross-sectional side view showing a liner layer formed on the recessed conductive layers of the bottom heaters, in accordance with an embodiment of the present invention.

FIG. 5 is a cross-sectional side view showing a liner layer formed on the recessed conductive layers of the bottom heaters, in accordance with an embodiment of the present invention.

In one or more embodiments, a liner layer 170 can be formed on the dielectric cover layer 130 and the recessed conductive layers of the bottom heaters, where the liner layer 170 can be formed by a conformal deposition. In various embodiments, the liner layer 170 can be excluded, so a subsequently formed phase change material layer directly on the dielectric cover layer 130.

In various embodiments, the liner layer 170 can be made of silicon carbide (SiC), a metal compound, for example, tantalum nitride (TaN), tantalum carbide (TaC), titanium nitride (TiN), titanium carbide (TiC), and combinations thereof.

In various embodiments, the projected memory device or cell can have a carefully designed segment of a non-insulating material (projection segment) having a high resistivity that is parallel to the phase-change material segment. The resistance of this projection segment can be judiciously chosen, such that it has only a marginal influence on the write operation (during which the phase transition occurs), but a significant influence on the read operation. This is possible because electrical transport in amorphous phase-change materials is highly nonlinear. At high electric fields, the amorphous PCM undergoes a so-called electronic threshold switching, leading to a low-resistive state (i.e., an ON state). Thus, if during the high-field write process the resistance of the projection component is significantly higher than the ON-state resistance of the amorphous region, most of the current will flow through the phase-change segment. During the low-field read process, however, the current bypasses the highly resistive amorphous region and flows through that part of the projection segment that is parallel to it. Hence, the resistance of the device is dominated by the resistance of that part of the projection segment, and thus is a good measure of the amorphous/crystalline phase configuration. The information that typically is stored into the length of the amorphous region is in a sense projected onto the projection component. Note that even though the projection segment is present during both read and write operations, the 'projection' is designed to occur only during the read process. In various embodiments, the projection is the liner layer 170, which provides a parallel conduction path to the PCM.

In various embodiments, the liner layer 170 can have a thickness in a range of about 1 nm to about 20 nm, or about 1 nm to about 10 nm, or about 6 nm to about 20 nm, although other thicknesses are also contemplated.

Figure 6:
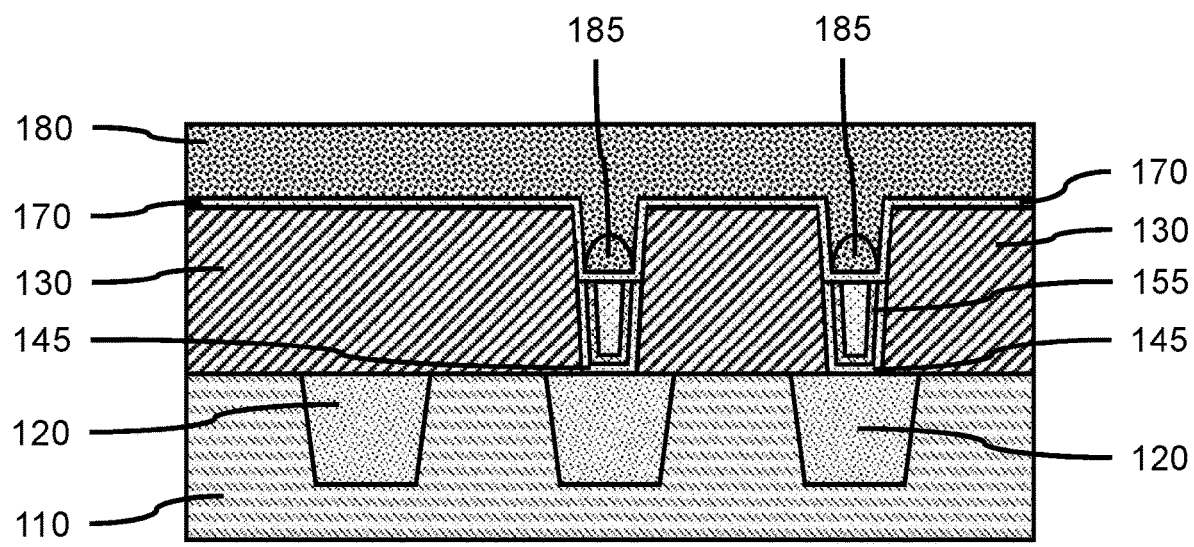
FIG. 6 is a cross-sectional side view showing a phase change material layer formed on the liner layer and conductive plug, in accordance with an embodiment of the present invention.

FIG. 6 is a cross-sectional side view showing a phase change material layer formed on the liner layer and conductive plug, in accordance with an embodiment of the present invention.

In one or more embodiments, a phase change material layer 180 can be formed on the liner layer 170, where the phase change material layer 180 can be formed by a chemical vapor deposition (CVD), plasma enhanced CVD (PECVD), physical vapor deposition (PVD), or combinations thereof.

In various embodiments, the phase change material layer 180 can be a chalcogenide glass, for example, germanium-antimony-tellurium (GeSbTe or GST), alloys of gallium (Ga)/Sb, indium (In)/Sb, In/selenium (Se), Sb/Te, Ge/Te, In/Sb/Te, Ga/Se/Te, Sn/Sb/Te, In/Sb/Ge, silver (Ag)/In/Sb/Te, Ge/Sb/Se/Te, Te/Ge/Sb/sulfur (S). In various embodiments, the phase change material layer 180 can be a chalcogenide glass, for example, germanium-antimony-tellurium (GeSbTe or GST) with silicon dioxide ($SiO_2$) or nitrogen (N) doping. In various embodiments, the phase change material layer 180 can be a phase change hetrostructure (PCH), such as stacked GST with MX (X=Te, M=Ti, Zr, Ni, Mo, etc.).

The phase change material can be formed from a class of materials including chalcogenide based materials. Chalcogens include any of the four elements oxygen (O), sulfur (S), selenium (Se), and tellurium (Te), forming part of group VI of the periodic table. Chalcogenides can comprise compounds of a chalcogen with a more electropositive element or radical. Chalcogenide alloys can comprise combinations of chalcogenides with other materials such as transition metals. A chalcogenide alloy can contain one or more elements from column six of the periodic table of elements, such as germanium (Ge) and tin (Sn). Chalcogenide alloys can include combinations, for example, of one or more of antimony (Sb), gallium (Ga), indium (In), and silver (Ag). Phase change based memory materials can be alloys of Ga/Sb, In/Sb, In/Se, Sb/Te, Ge/Te, Ge/Sb/Te, In/Sb/Te, Ga/Se/Te, Sn/Sb/Te, In/Sb/Ge. Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $TeGe.Sb_{100-(a+b)}$. More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties.

In various embodiments, the phase change material layer 180 can have a thickness in a range of about 20 nm to about 100 nm, or about 10 nm to about 80 nm, although other thicknesses are also contemplated. For the PCM region 185 there can be side damage or material loss from an etching process, where some marginal thickness is included, and for the confined cell structure we can have about 10 nm to about 100 nm thickness because there is no RIE damage on side.

In one or more embodiments, a PCM region 185 having a mushroom shape can be formed in the trenches 135 on the bottom heaters, where the PCM region 185 is the PCM material in a crystalline state/phase formed by passage of a current through the phase change material. The phase change to form the PCM region 185 can be part of a write process. A melt-quenched amorphization of the PCM using the bottom heater can provide a RESET operation that eliminates the crystalline PCM region 185. Structural relaxation can also occur in the PCM resulting in a steady increase in electrical resistivity with time at ambient temperatures, which is known as resistance drift. The amorphous and crystalline phases of the PCM have different resistivities that can be detected.

Figure 7:
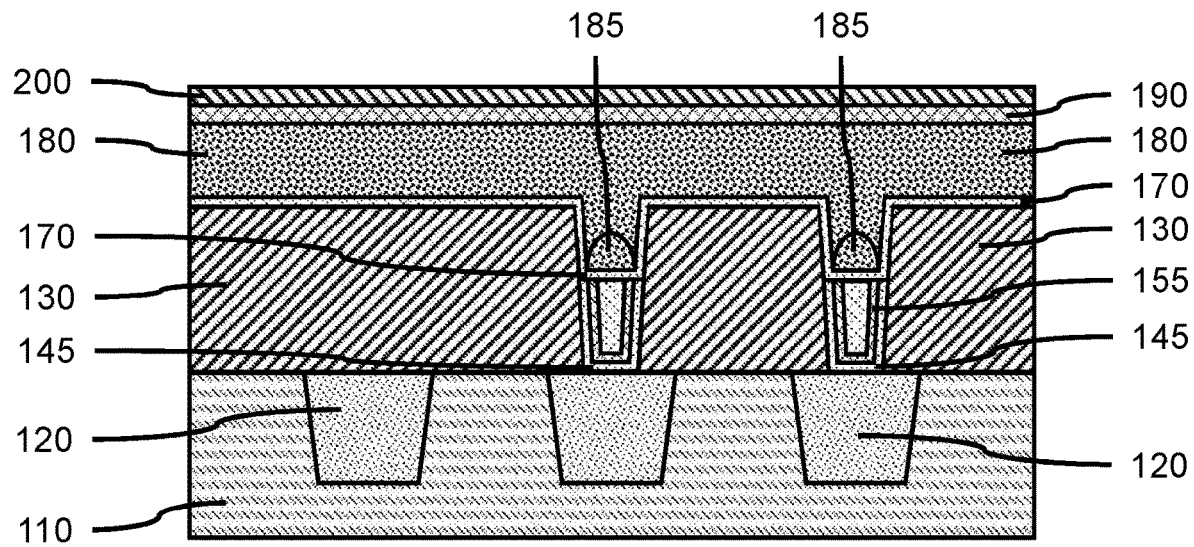
FIG. 7 is a cross-sectional side view showing a protective layer formed on the phase change material layer, and a template layer formed on the protective layer, in accordance with an embodiment of the present invention.

FIG. 7 is a cross-sectional side view showing a protective layer formed on the phase change material layer, and a template layer formed on the protective layer, in accordance with an embodiment of the present invention.

In one or more embodiments, a protective layer 190 can be formed on the phase change material layer 180, where the protective layer 190 can be formed by a conformal deposition.

In various embodiments, the protective layer 190 can be a conductive metal or metal compound, for example, titanium nitride (TiN), titanium carbide (TiC), tantalum nitride (TaN), tantalum carbide (TaC), tungsten (W), platinum (Pt), iridium (Jr), and combinations thereof. The protective layer 190 can have a low resistance and good adhesion to the PCM. The protective layer 190 can function as a top electrode. The protective layer 190 can be the same material as the liner layer 170, which can function as a bottom electrode.

In various embodiments, the protective layer 190 can have a thickness in a range of about 10 nm to about 300 nm, or about 10 nm to about 100 nm, or about 30 nm to about 300 nm, although other thicknesses are also contemplated.

In one or more embodiments, a template layer 200 can be formed on the protective layer 190, where the template layer 200 can be formed by a conformal deposition.

In various embodiments, the template layer 200 can be a hardmask layer made of silicon oxide (SiO), silicon nitride (SiN), silicon oxynitride (SiON), silicon oxy carbide (SiOC), silicon carbonitride (SiCN), silicon boro carbonitride (SiBCN), and combinations thereof.

In various embodiments, the template layer 200 can have a thickness in a range of about 10 nm to about 300 nm, or about 10 nm to about 100 nm, or about 30 nm to about 300 nm, although other thicknesses are also contemplated.

Figure 8:
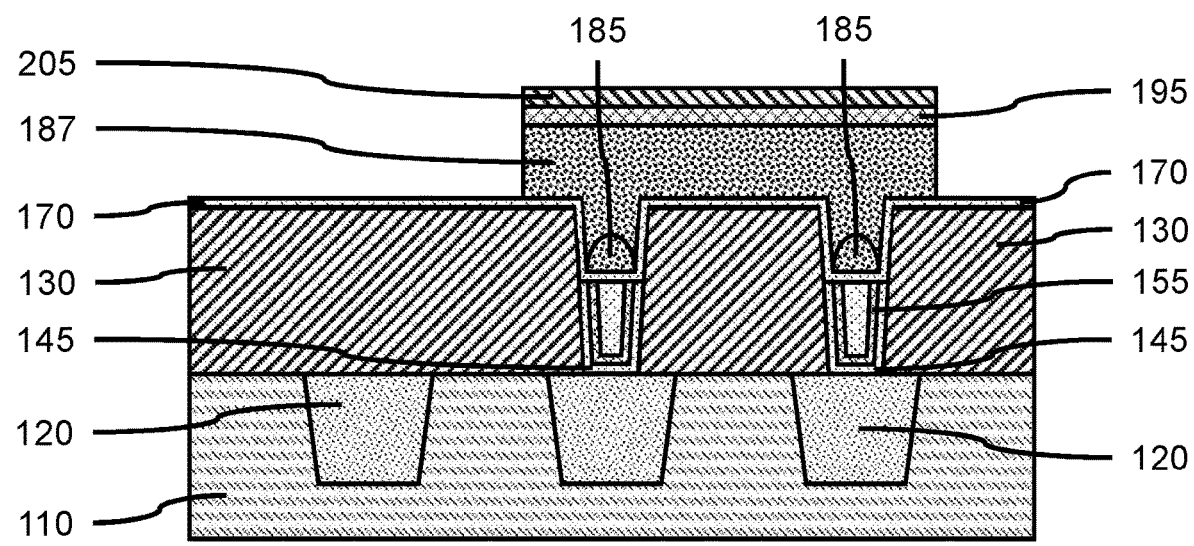
FIG. 8 is a cross-sectional side view showing the template layer, protective layer, and phase change material layer patterned to form a phase change material block over the bottom heaters recessed in the trenches, in accordance with an embodiment of the present invention.

FIG. 8 is a cross-sectional side view showing the template layer, protective layer, and phase change material layer patterned to form a phase change material block over the bottom heaters recessed in the trenches, in accordance with an embodiment of the present invention.

In one or more embodiments, the template layer 200 can be patterned using lithographic processes and etching to form a phase change material template 205 above one or more bottom heaters and trenches. The protective layer 190 can be patterned using the phase change material template 205 as a mask and etching to form a protective slab 195 on the phase change material layer 180. Portions of the phase change material layer 180 exposed by forming the phase change material template 205 and protective slab 195 can be removed using a directional etch (e.g., RIE) to form a phase change material block 187 over the bottom heaters in the trenches. The phase change material block 187 can be on the liner layer 170 on the dielectric cover layer and in the trench.

Figure 9:
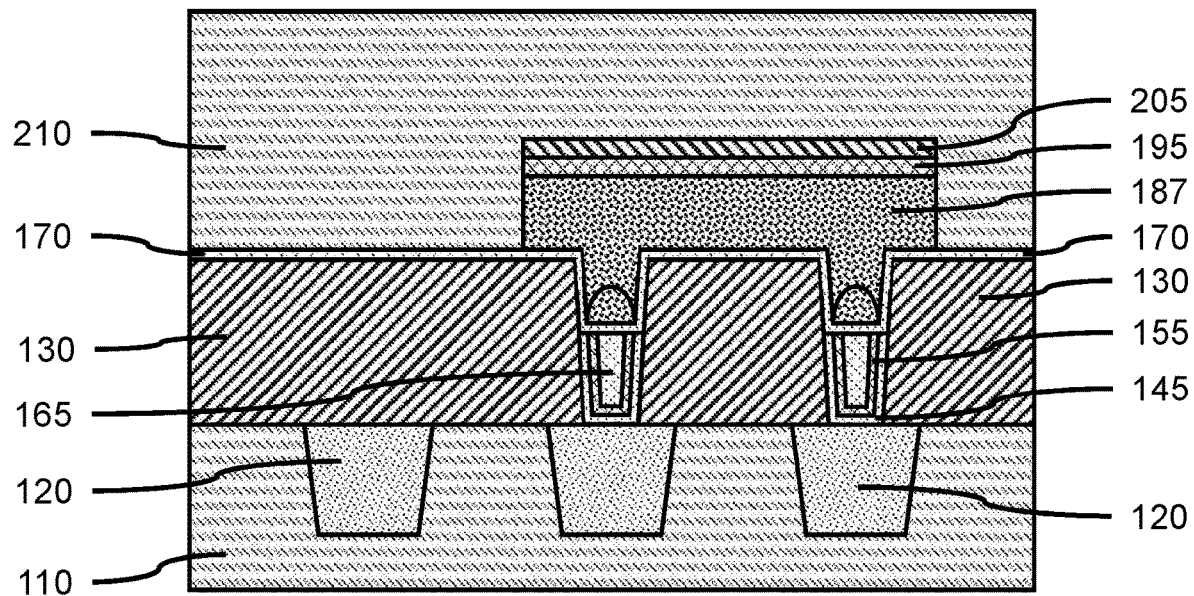
FIG. 9 is a cross-sectional side view showing a fill layer on the template layer, phase change material layer, and liner layer, in accordance with an embodiment of the present invention.

FIG. 9 is a cross-sectional side view showing a fill layer on the template layer, phase change material layer, and liner layer, in accordance with an embodiment of the present invention.

In one or more embodiments, a fill layer 210 can be formed on the phase change material template 205 and liner layer 170, where the fill layer 210 can be formed by a blanket deposition, for example, CVD or spin-on.

In various embodiments, the fill layer 210 can be an electrically insulating dielectric material, including, but not limited to, silicon oxide (SiO), silicon nitride (SiN), silicon oxynitride (SiON), silicon oxy carbide (SiOC), silicon carbonitride (SiCN), silicon boro carbonitride (SiBCN), low-k dielectrics, and combinations thereof. Low-k dielectric can include, but not be limited to, carbon doped silicon oxide or organosilicate glasses (SiO:C), fluorine doped silicon oxide (SiO:F), silicon based polymeric dielectric materials, for example, hydrogen silsesquioxane (HSQ) and methylsilsesquioxane (MSQ), tetraethyl orthosilicate (TEOS), and combinations thereof.

Figure 10:
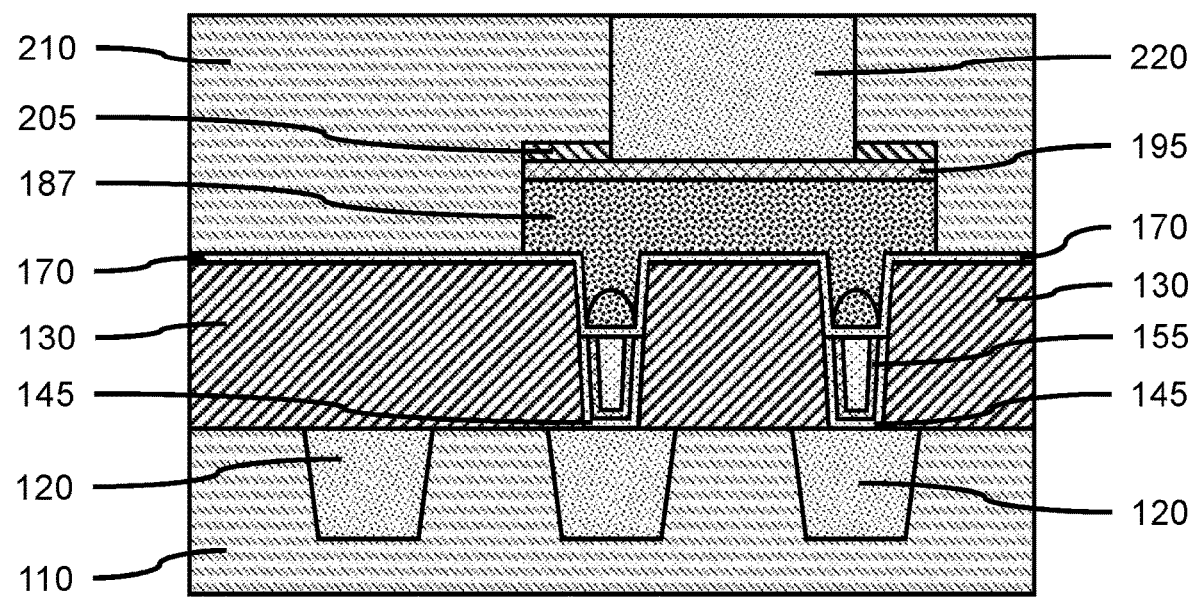
FIG. 10 is a cross-sectional side view showing a top conductive contact formed in the fill layer over the protective layer, in accordance with an embodiment of the present invention.

FIG. 10 is a cross-sectional side view showing a top conductive contact formed in the fill layer over the protective layer, in accordance with an embodiment of the present invention.

In one or more embodiments, a top conductive contact 220 can be formed in the fill layer 210 using lithographic processes and etching to form an opening. The opening can extend through the phase change material template 205 to the protective slab 195. The top conductive contact 220 can be deposited in the opening and a CMP used to remove excess material. The top conductive contact 220 can be in physical and electrical contact with the protective slab 195.

Figure 11:
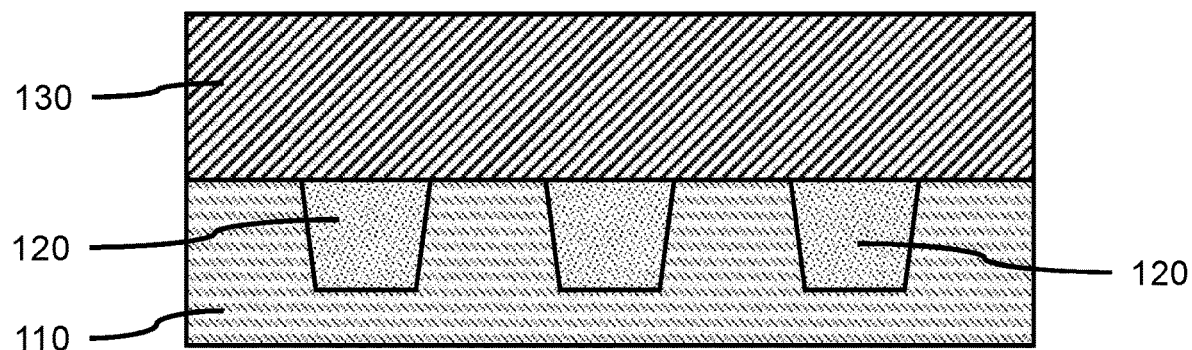
FIG. 11 is a cross-sectional side view showing electrical contacts in a substrate with a dielectric cover layer on the electrical contacts and substrate surface, in accordance with an embodiment of the present invention.

FIG. 11 is a cross-sectional side view showing electrical contacts in a substrate with a dielectric cover layer on the electrical contacts and substrate surface, in accordance with an embodiment of the present invention.

In one or more embodiments, one or more electrical contacts 120 can be formed in a substrate 110. A dielectric cover layer 130 can be formed on the electrical contacts and substrate surface.

Figure 12:
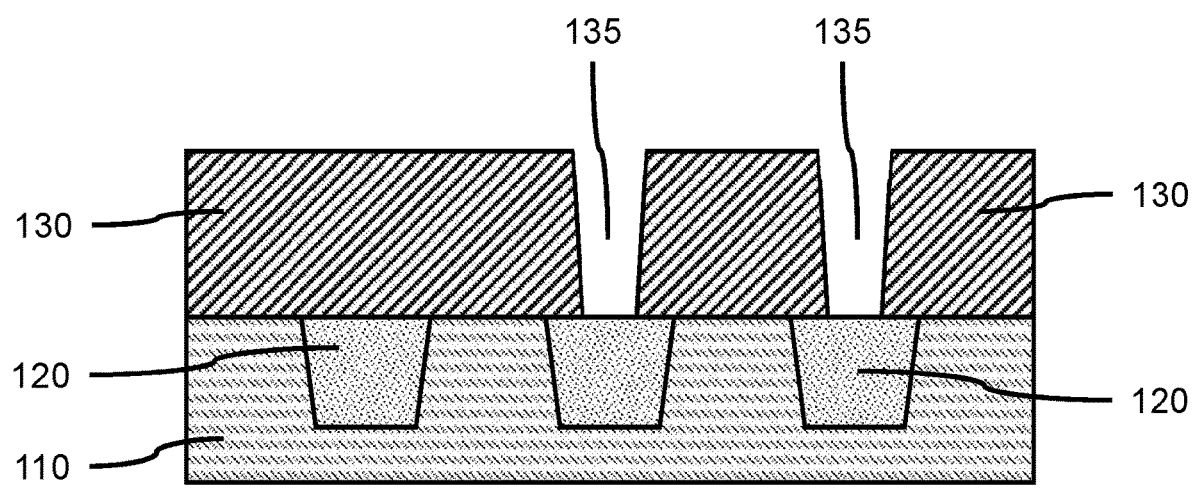
FIG. 12 is a cross-sectional side view showing trenches formed in the cover layer above the electrical contacts, in accordance with an embodiment of the present invention.

FIG. 12 is a cross-sectional side view showing trenches formed in the cover layer above the electrical contacts, in accordance with an embodiment of the present invention.

In one or more embodiments, a trench 135 can be formed in the dielectric cover layer 130 over an electrical contact 12. A portion of the dielectric cover layer 130 can be removed to expose the surface of an electrical contact 120 at the bottom of the trench 135. In various embodiments, a trench 135 can be formed over each of the one or more electrical contacts 120.

Figure 13:
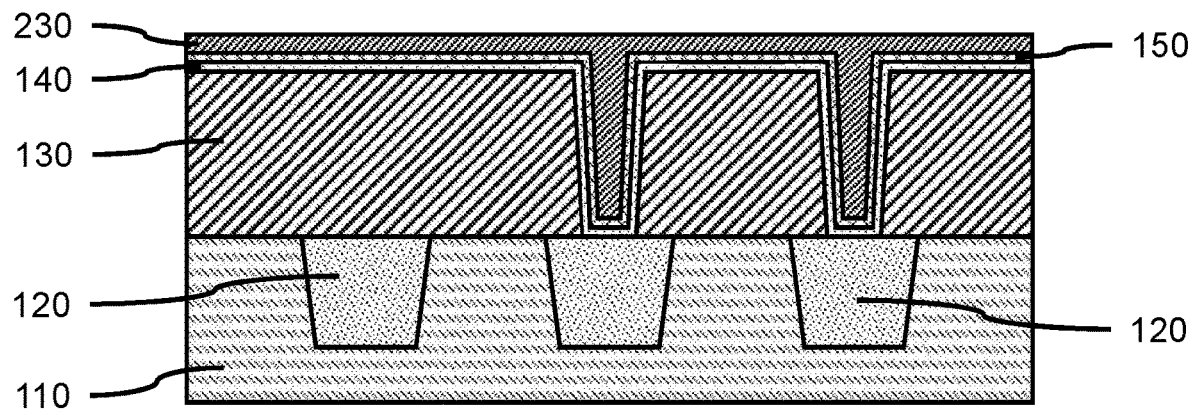
FIG. 13 is a cross-sectional side view showing conductive layers of bottom heaters formed in the trenches on the electrical contacts, and a dielectric plug layer formed on the conductive layers, in accordance with an embodiment of the present invention.

FIG. 13 is a cross-sectional side view showing conductive layers of bottom heaters formed in the trenches on the electrical contacts, and a dielectric plug layer formed on the conductive layers, in accordance with an embodiment of the present invention.

In one or more embodiments, a lower conductive layer 140 can be formed on the exposed surfaces of the dielectric cover layer 130 and the trench(es) 135. An upper conductive layer 150 can be formed on the lower conductive layer 140.

In one or more embodiments, an insulating plug layer 230 can be formed on the upper conductive layer 150, where the insulating plug layer 230 can be formed by a conformal deposition (e.g., ALD, PEALD). The insulating plug layer 230 can fill in the remaining volume of the trench(es) 135, where the insulating plug layer 230 may not form a void space in the trench(es) 135.

Figure 14:
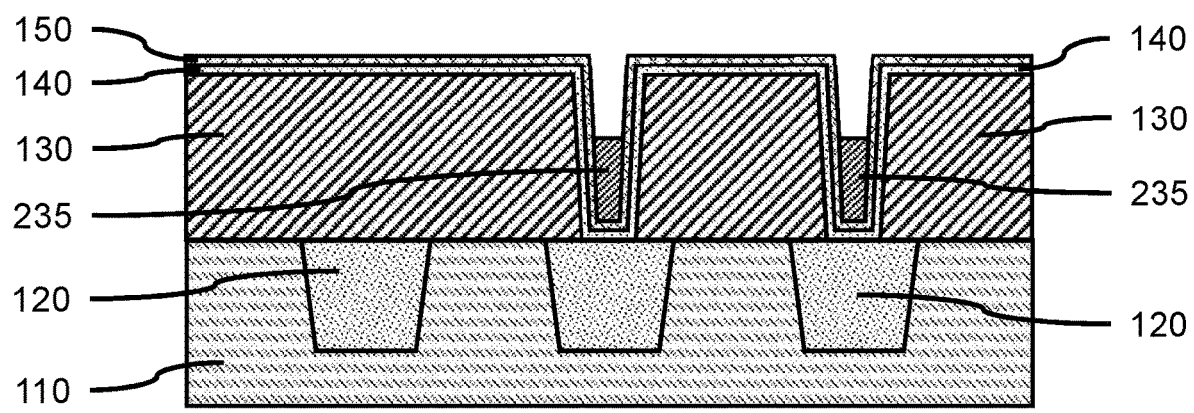
FIG. 14 is a cross-sectional side view showing the dielectric plug layer partially removed and recessed in the trenches to form dielectric plugs, in accordance with an embodiment of the present invention.

FIG. 14 is a cross-sectional side view showing the dielectric plug layer partially removed and recessed in the trenches to form dielectric plugs, in accordance with an embodiment of the present invention.

In one or more embodiments, the portions of the insulating plug layer 230 on the top surface of the upper conductive layer 150 on the dielectric cover layer 130 can be removed to leave portions of the insulating plug layer 230 on the upper conductive layer 150 and lower conductive layer 140 in the trench 135. The remaining portion of the insulating plug layer 230 in the trench 135 can form an insulating plug 235.

In various embodiments, the insulating plug 235 in the trench 135 can have a height in a range of about 5 nm to about 200 nm, or about 5 nm to about 50 nm, or about 20 nm to about 200 nm, although other heights are also contemplated. The thickness of the insulating plug 235 can depend on the intended current to be passed.

Figure 15:
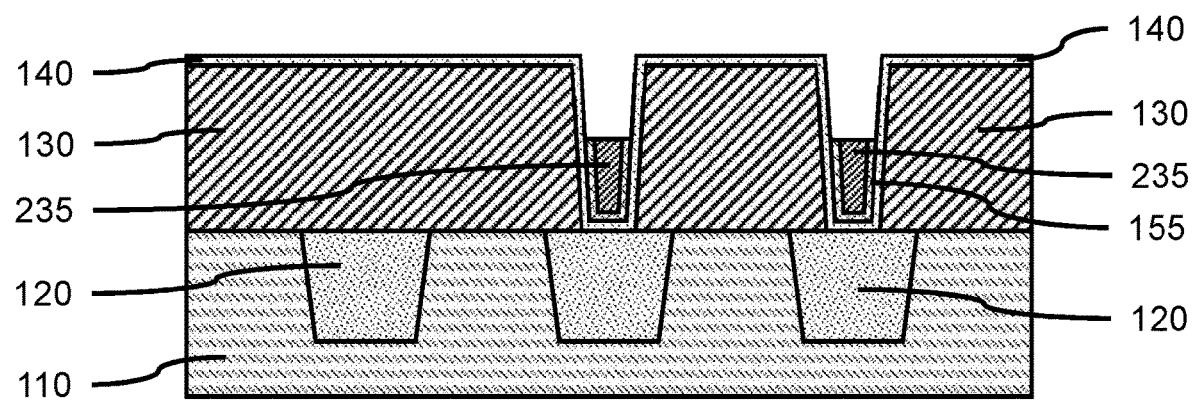
FIG. 15 is a cross-sectional side view showing exposed portions of an upper conductive layer of the bottom heaters removed to expose a lower conductive layer, in accordance with an embodiment of the present invention.

FIG. 15 is a cross-sectional side view showing exposed portions of an upper conductive layer of the bottom heaters removed to expose a lower conductive layer, in accordance with an embodiment of the present invention.

In one or more embodiments, exposed portions of the upper conductive layer 150 can be removed to leave portions of the upper conductive layer 150 on the lower conductive layer 140 in the trench 135. The insulating plug 235 can mask a remaining portion of the upper conductive layer 150 in the trench 135.

Figure 16:
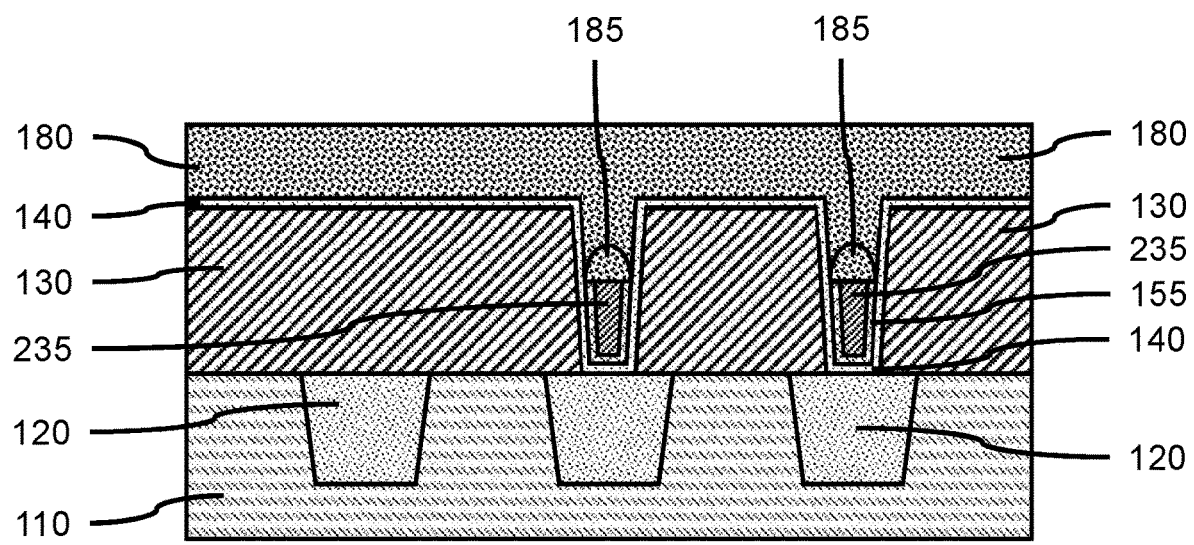
FIG. 16 is a cross-sectional side view showing a phase change material layer formed on the lower conductive layer and dielectric plug, in accordance with an embodiment of the present invention.

FIG. 16 is a cross-sectional side view showing a phase change material layer formed on the lower conductive layer and dielectric plug, in accordance with an embodiment of the present invention.

In one or more embodiments, a phase change material layer 180 can be formed on the lower conductive layer 140 and the insulating plug 235 and upper conductive layer 150 in the trench 135. In one or more embodiments, a PCM region 185 can be formed in the trenches 135 on the bottom heaters.

Figure 17:
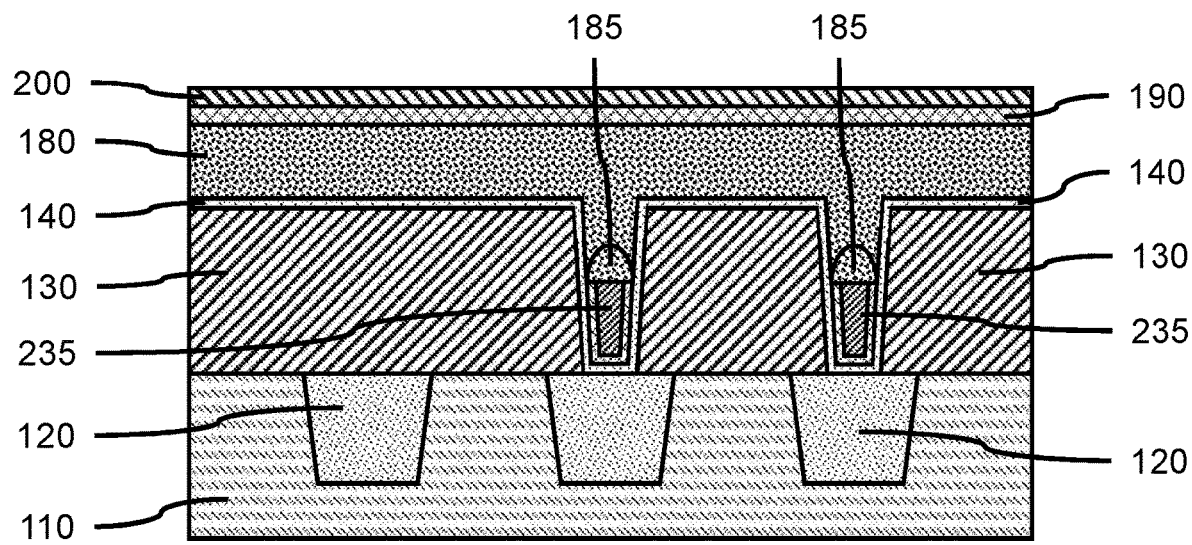
FIG. 17 is a cross-sectional side view showing a protective layer formed on the phase change material layer, and a template layer formed on the protective layer, in accordance with an embodiment of the present invention.

FIG. 17 is a cross-sectional side view showing a protective layer formed on the phase change material layer, and a template layer formed on the protective layer, in accordance with an embodiment of the present invention.

In one or more embodiments, a protective layer 190 can be formed on the phase change material layer 180, where the protective layer 190 can be formed by a conformal deposition. In one or more embodiments, a template layer 200 can be formed on the protective layer 190, where the template layer 200 can be formed by a conformal deposition.

Figure 18:
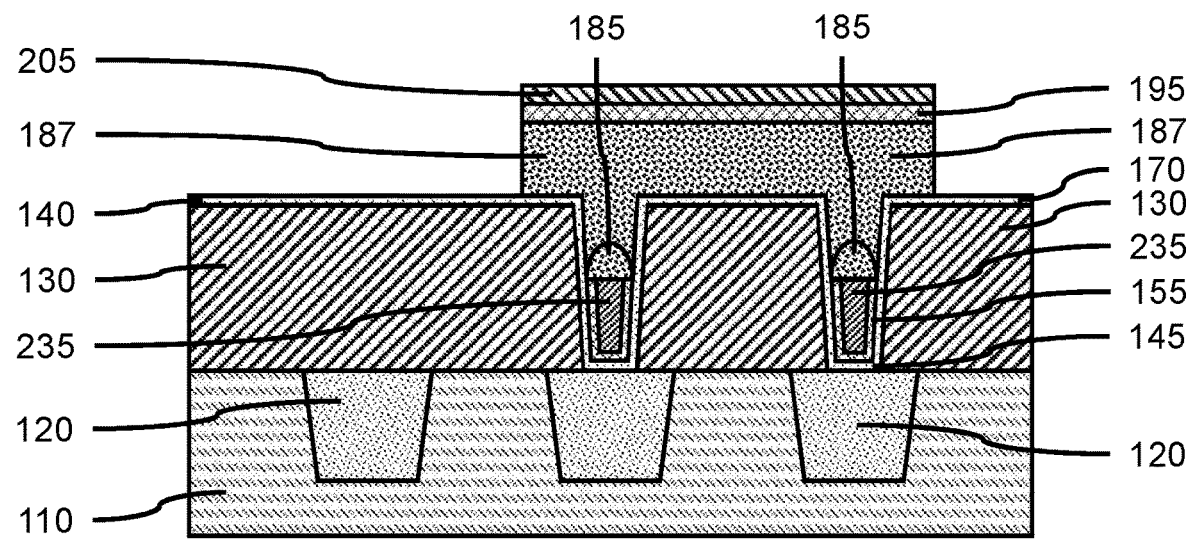
FIG. 18 is a cross-sectional side view showing the template layer, protective layer, and phase change material layer patterned to form a phase change material block over the bottom heaters recessed in the trenches, in accordance with an embodiment of the present invention.

FIG. 18 is a cross-sectional side view showing the template layer, protective layer, and phase change material layer patterned to form a phase change material block over the bottom heaters recessed in the trenches, in accordance with an embodiment of the present invention.

In one or more embodiments, the template layer 200 can be patterned using lithographic processes and etching to form a phase change material template 205 above one or more bottom heaters and trenches. The protective layer 190 can be patterned using the phase change material template 205 as a mask and etching to form a protective slab 195 on the phase change material layer 180. Portions of the phase change material layer 180 exposed by forming the phase change material template 205 and protective slab 195 can be removed using a directional etch (e.g., RIE) to form a phase change material block 187 over the bottom heaters in the trenches.

Figure 19:
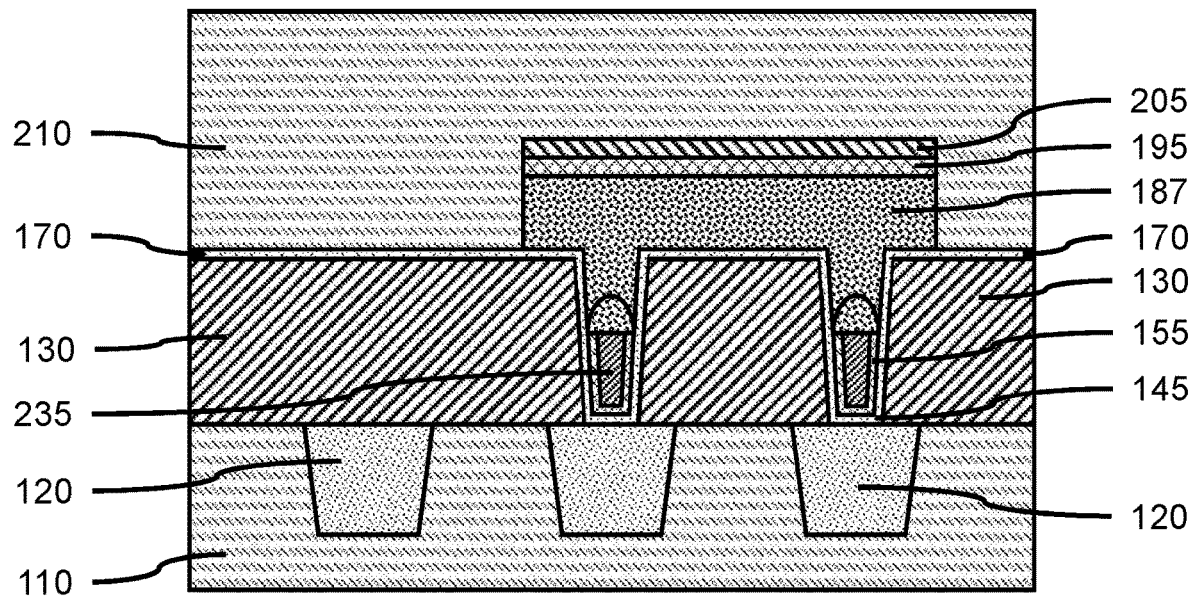
FIG. 19 is a cross-sectional side view showing a fill layer on the template layer, phase change material layer, and lower conductive layer, in accordance with an embodiment of the present invention.

FIG. 19 is a cross-sectional side view showing a fill layer on the template layer, phase change material layer, and lower conductive layer, in accordance with an embodiment of the present invention.

In one or more embodiments, a fill layer 210 can be formed on the phase change material template 205 and liner layer 170, where the fill layer 210 can be formed by a blanket deposition, for example, CVD or spin-on.

Figure 20:
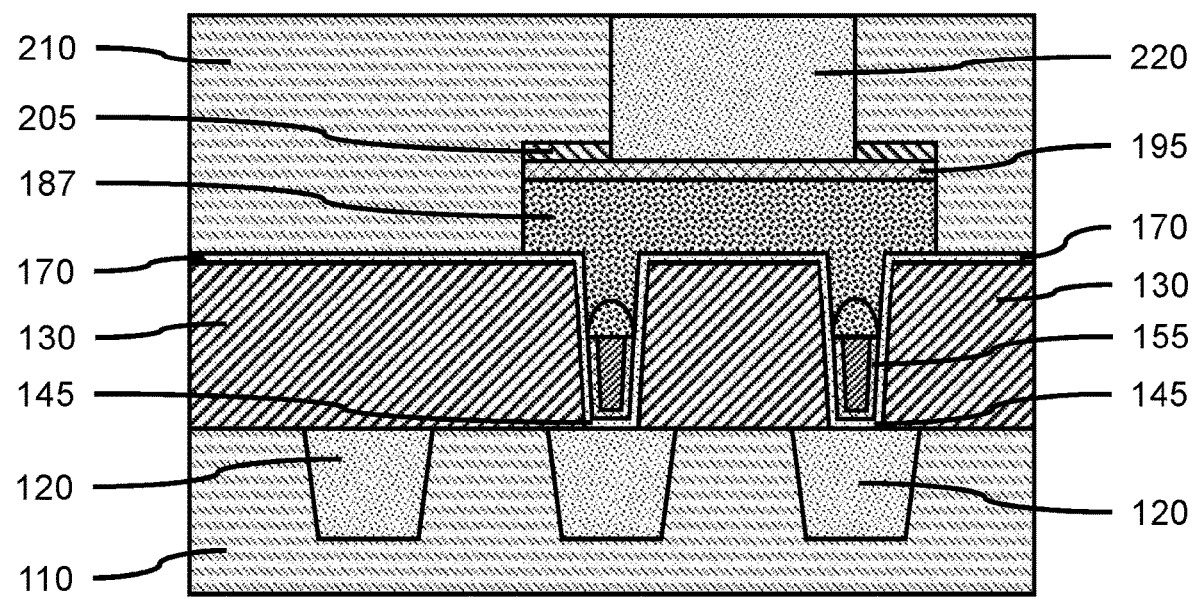
FIG. 20 is a cross-sectional side view showing a top conductive contact formed in the fill layer over the protective layer, in accordance with an embodiment of the present invention.

FIG. 20 is a cross-sectional side view showing a top conductive contact formed in the fill layer over the protective layer, in accordance with an embodiment of the present invention.

In one or more embodiments, a top conductive contact 220 can be formed in the fill layer 210 using lithographic processes and etching to form an opening. The opening can extend through the phase change material template 205 to the protective slab 195. The top conductive contact 220 can be deposited in the opening and a CMP used to remove excess material. The top conductive contact 220 can be in physical and electrical contact with the protective slab 195.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used therein, the singular forms "a," "an" and "the" are intended to include the plural forms as well, unless the context clearly indicates otherwise. It will be further understood that the terms "comprises," "comprising," "includes" and/or "including," used herein, specify the presence of stated features, integers, steps, operations, elements and/or components, but do not preclude the presence or addition of one of more other features, integers, steps, operations, elements, components and/or groups thereof.

Spatially relative terms, such as "beneath," "below," "lower," "above," "upper," like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A phase change material memory device, comprising:
    one or more electrical contacts in a substrate;
    a dielectric cover layer on the electrical contacts and substrate;
    a lower conductive shell trench above one of the one or more electrical contacts;
    an upper conductive shell inside the trench on the lower conductive shell, wherein be lower conductive shell keeps the upper conductive shell apart from the dielectric cover layer in a horizontal direction with respect to an upper surface of the substrate;
    a conductive plug filling the upper conductive shell;
    a liner layer on the dielectric cover layer and covering the conductive plug; and
    a phase change material block over the liner layer and the conductive plug, and in the trench.

2. The phase change material memory device of claim 1, wherein the trench has a width in a range of about 25 nanometers (nm) to about 100 nm.

3. The phase change material memory device of claim 1, wherein the phase change material block is germanium-antimony-tellurium (GeSbTe).

4. The phase change material memory device of claim 1, wherein the lower conductive shell is a metal compound having a resistivity of about 45 kOhm/sq at 5 nm thickness.

5. The phase change material memory device of claim 1, further comprising a protective slab on the phase change material block.

6. The phase change material memory device of claim 5, further comprising a top conductive contact on the protective slab.

7. The phase change material memory device of claim 6, wherein the conductive plug is a metal compound having a resistivity of about 45 kOhm/sq at 5 nm thickness.

* * * * *